United States Patent [19]

Wang et al.

[11] Patent Number: 5,606,285

[45] Date of Patent: Feb. 25, 1997

[54] POWER CONTROL CIRCUIT FOR USE WITH TRANSMITTER

[75] Inventors: Hefeng Wang; Tetsuo Onodera, both of Tokyo, Japan

[73] Assignee: OKI Electric Industry Co., Ltd., Tokyo, Japan

[21] Appl. No.: 505,815

[22] Filed: Jul. 21, 1995

[30] Foreign Application Priority Data

Jul. 29, 1994 [JP] Japan .................................. 6-178695

[51] Int. Cl.$^6$ ...................................... H03G 3/30
[52] U.S. Cl. .................. 330/134; 330/138; 330/279; 330/280; 455/126
[58] Field of Search .................. 330/129, 134, 330/138, 139, 140, 279, 280; 455/116, 126, 127

[56] References Cited

U.S. PATENT DOCUMENTS

| 4,194,164 | 3/1980 | Owen | 330/134 X |
| 5,283,533 | 2/1994 | Hori | 330/134 X |
| 5,432,473 | 7/1995 | Mattila et al. | 330/134 X |

FOREIGN PATENT DOCUMENTS

| 181832 | 10/1984 | Japan | 455/116 |
| 45614 | 3/1986 | Japan | 330/279 |
| 260709 | 10/1990 | Japan | 330/279 |

OTHER PUBLICATIONS

Jurg Hinderling et al, "Modulator–Demodulator Circuits for CDMA Digital Portable Mobile Telephone System Condensed on a Single Chip", Nikkei Electronics, Apr. 26, 1993 pp. 163–175.

Klein S. Gilhousen et al, "On The Capacity Of A Cellular CDMA System", IEEE Transaction on Vehicular Technology, vol. 40, No. 2, May 1991, pp. 303–311.

Kuhlman, Jr., "High–Power Solid–State 5.9–12.4 GHZ Sweepers", Hewlett–Packard Journal, vol. 28, No. 3, Nov. 1976, pp. 19–24.

Primary Examiner—James B. Mullins
Attorney, Agent, or Firm—Law Office of Steven M. Rabin

[57] ABSTRACT

A power control circuit having a saturation preventing control loop including a variable gain amplifier, an RF power amplifier, a directional coupler, a detecting circuit, a comparator, a switch, and an adder. When the signal level of an output signal of the comparator is low, the switch is turned on. When the signal level of the output signal of the comparator is high, the switch is turned off. A system power control loop includes a system power control terminal, the adder, and the variable gain amplifier. Since the saturation preventing control loop is provided with the switch, the saturation preventing control loop operates only when the signal level of the amplified signal is larger than a reference value. The system power control loop can properly operate according to a system power control signal supplied from the system power control terminal.

12 Claims, 5 Drawing Sheets

PRIOR ART 5,606,285

POWER CONTROL CIRCUIT FOR USE WITH TRANSMITTER

BACKGROUND OF THE INVENTION

The present invention relates to a power control circuit for use with a transmitter, in particular, to a power control circuit having a power amplifier for linearly amplifying a signal and outputting the amplified signal.

In, for example, an AM modulating method performed by a transmitting system, the control of power fluctuation of a transmission signal may be an important factor for improving the performance. A transmitter used in such a transmission system has an RF (Radio Frequency) power amplifier that linearly amplifies a signal and outputs the amplified signal.

In addition, the RF power amplifier should amplify a signal in a linear region so as to prevent the signal from distorting.

However, due to various causes such as a temperature change, the gain of a pre-stage amplifier of the RF power amplifier may fluctuate, thereby causing the input level of the RF power amplifier to fluctuate. If the RF power amplifier operates in the saturation region due to the fluctuation, it cannot linearly amplify the input signal. Thus, since the signal largely distorts, required spurious standard cannot be satisfied.

To solve this problem, a saturation preventing control loop method is known. In this control method, an output signal of the RF power amplifier is detected. The detected output voltage is compared with a reference voltage. The pre-stage variable gain amplifier is controlled corresponding to the relation between the output voltage and the reference voltage. Thus, the output power of the RF power amplifier is controlled so that the RF power amplifier does not operate in the saturation region. FIG. 1 is a schematic diagram showing the construction of a circuit according to this control method.

In the power control circuit that operates according to the saturation preventing control loop method, a modulated signal that includes speech information and the like, that are input from an input terminal 1, is amplified by a variable gain amplifier 2. The amplified signal is supplied to an RF power amplifier 3. The RF power amplifier 3 amplifies the input signal with a predetermined amplitude. The amplified modulated signal is supplied from the RF power amplifier 3 to a signal output terminal 5 through a directional coupler 4. The directional coupler 4 extracts a part of the modulated signal. The extracted modulated signal is detected by a detecting circuit 6. A comparator 8 compares the level of the detected signal with a predetermined reference voltage supplied from a reference voltage supply terminal 7. The comparison result of the comparator 8 is fed back to the gain of the variable gain amplifier 2. Thus, the level of the modulated signal that is supplied from the variable gain amplifier 2 is adjusted.

In other words, when the level of the detected signal is higher than the reference voltage, the gain of the variable gain amplifier 2 is decreased so as to decrease the level of the modulated signal that is supplied to the RF power amplifier 3. When the level of the detected signal is lower than the reference voltage, the gain of the variable gain amplifier 2 is increased so as to increase the level of the modulated signal that is supplied to the RF power amplifier 3.

The saturation preventing control loop 20 always properly maintains the level of the modulated signal that is supplied to the RF power amplifier 3, thereby preventing the RF power amplifier 3 from operating in the saturation region.

However, the circuit shown in FIG. 1 only controls the output power of the saturation preventing control loop method according to the reference voltage supplied from the reference voltage supply terminal 7.

For example, as in a CDMA (Code Division Multiple Access) cellular system that should control transmission power for maintaining the maximum system capacity, the above-described variable gain amplifier should have a control signal corresponding to the required transmission power.

However, in the circuit shown in FIG. 1, the transmission power can be controlled according to the reference voltage supplied to the reference voltage supply terminal 7. In this method, however, due to the response time and output power detecting characteristics of the loop, the system standard cannot be adequately satisfied.

The present invention is made to solve such a problem. An object of the present invention is to prevent an RF power amplifier used to perform a conventional saturation preventing control loop method from saturating in the case that the system transmits a signal with maximum power, and to disconnect the saturation preventing loop for controlling the transmission power in the case that the system transmits a signal without the maximum power so as to satisfy characteristics required for the power control method of the system.

SUMMARY OF THE INVENTION

In a transmission power control system such as a CDMA cellular system, when the transmission power of an RF power amplifier almost exceeds the maximum transmission power, a saturation preventing control loop should be activated. Otherwise, the output power of the RF power amplifier should be controlled according to the transmission power control method of the system.

Thus, the power control circuit of the present invention has a variable gain amplifier including an input terminal for inputting a signal to be transmitted, an output terminal for outputting an amplified signal of the input signal, and a gain control terminal for inputting a gain control signal. The amplitude of the input signal is controlled according to the gain control signal. A detecting portion detects the level of the signal amplified by the variable gain amplifier. A comparing portion compares the level of the amplified signal with a predetermined reference value.

One terminal of a switch is connected to an output terminal of the comparing portion. The other terminal of the switch is connected to an adder. When the level of the amplified signal is larger than the reference value, the switch is turned on. When the level of the amplified signal is smaller than the reference value, the switch is turned off.

In addition, a system power control terminal for supplying a system power control signal is connected to the adder. The adder outputs a gain control signal as the sum of the output signal of the system power control terminal and the output signal of the other terminal of the switch. The output signal of the adder is supplied to a gain control terminal of the variable gain amplifier.

The power control circuit has a variable gain amplifier and a summing amplifier. The variable gain amplifier includes an input terminal for inputting a signal, an output terminal for outputting an linearly amplified signal of the input signal, and a gain control terminal for inputting a gain control signal. The variable gain amplifier controls the amplitude of the input signal corresponding to the gain control signal. The summing amplifier includes a plurality of system power control terminals for inputting a plurality of system power control signals corresponding to predetermined characteristics such as those of the CDMA system. The adding circuit adds these system power control signals and outputs a gain control signal. The range of the input voltage of the system power control signal is converted so that the adding operation of the adding circuit is performed in a linear region.

These and other objects, features and advantages of the present invention will become more apparent in light of the following detailed description of best mode embodiments thereof, as illustrated in the accompanying drawings.

DETAILED DESCRIPTION OF THE PREFERRED EMBODIMENTS

Figure 2:
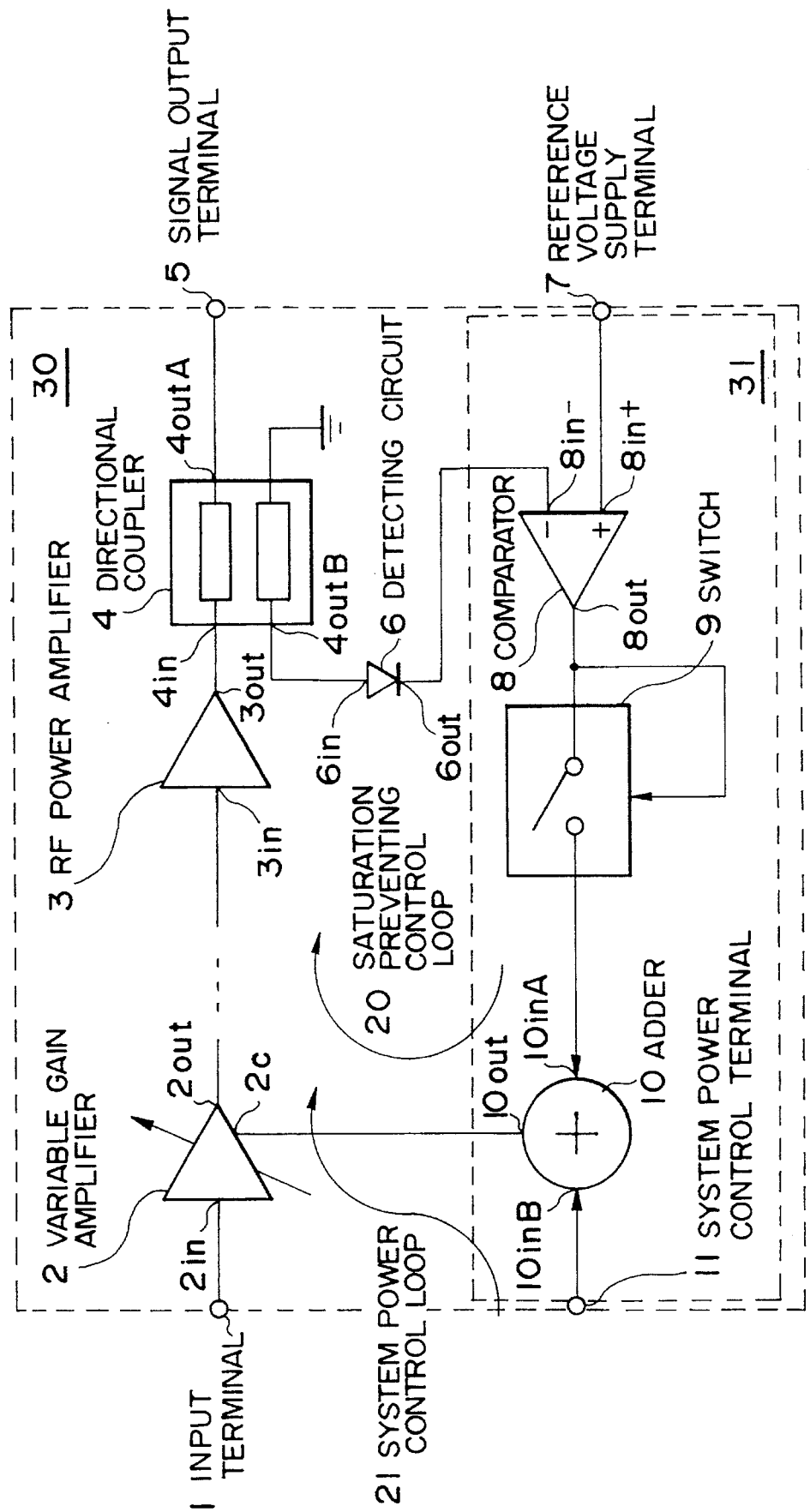
FIG. 2 is a block diagram for explaining the construction of a power control circuit according to a first embodiment of the present invention.
Figure 3:
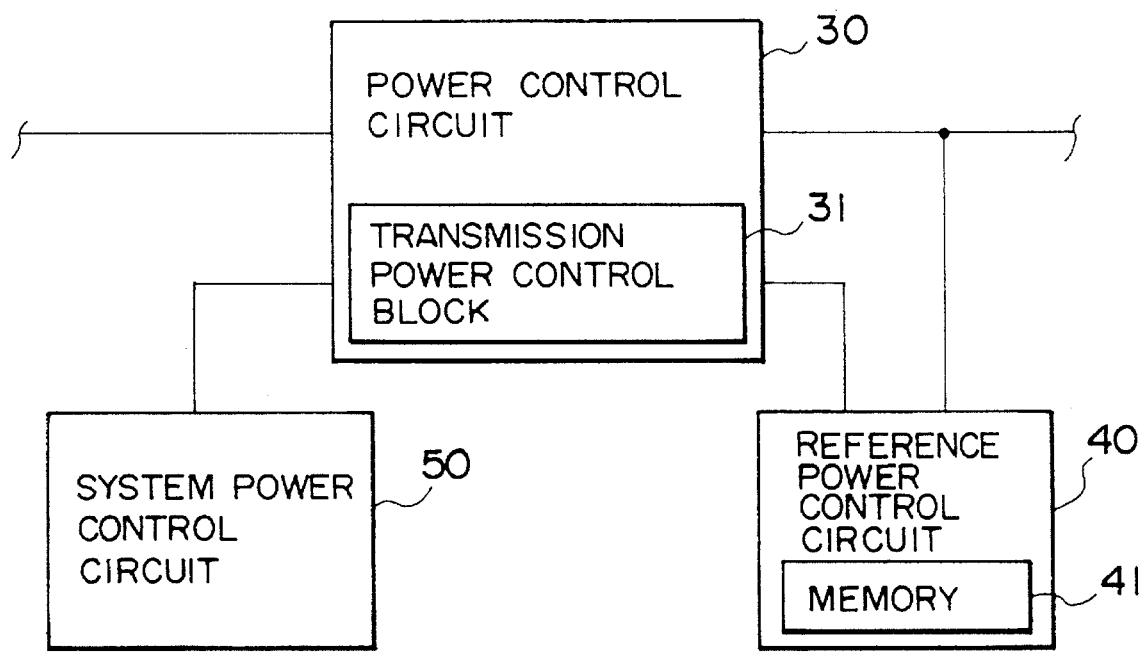
FIG. 3 is a block diagram showing connections of the power control circuit according to the first embodiment and another circuit.

Next, with reference to FIGS. 2 and 3, a first embodiment of the present invention will be described. FIG. 2 is a circuit diagram showing the construction of a power control circuit according to the present invention. FIG. 3 is a block diagram showing connections of the power control circuit of FIG. 2 and other circuits.

In the power control circuit 30, an input terminal 2in of a variable gain amplifier 2 is connected to an input terminal 1. An output terminal 2out of the variable gain amplifier 2 is connected to an input terminal 3in of an RF power amplifier 3 through another amplifier, a filter, a mixer, and so forth.

An output terminal 3out of the RF power amplifier 3 is connected to an input terminal 4in of a directional coupler 4. One output terminal 4outA of the directional coupler 4 is connected to a signal output terminal 5. Another output terminal 4outB of the directional coupler 4 is connected to an input terminal 6in of a detecting circuit 6. An output terminal 6out of the detecting circuit 6 is connected to a negative input terminal 8in− of a comparator 8.

A reference voltage supply terminal 7 is connected to a positive input terminal 8in+ of the comparator 8. One terminal of a switch 9 is connected to an output terminal 8out of the comparator 8. When the signal level of an output signal from the output terminal 8out is "L", the switch 9 is turned on. On the other hand, when the signal level is "H", the switch is turned off.

Another terminal of the switch 9 is connected to one input terminal 10inA of an adder 10. An output terminal 10out of the adder 10 is connected to a control terminal 2c of the variable gain amplifier 2.

The above-described variable gain amplifier 2, the RF power amplifier 3, the directional coupler 4, the detecting circuit 6, the comparator 8, the switch 9, the adder 10, and so forth construct a saturation preventing control loop 20.

On the other hand, a system power control terminal 11 is connected to another input terminal 10inB of the adder 10. The system power control terminal 11, the adder 10, the variable gain amplifier 2, and so forth construct a system power control loop 21.

A reference voltage control circuit 40 is connected to the signal output terminal 5. The reference voltage control circuit 40 detects the output power of the signal output terminal 5 and varies the reference voltage supplied to the reference voltage supply terminal 7 according to the detected result.

A system power control circuit 50 is connected to the system power control terminal 11. The system power control circuit 50 generates a predetermined system power control signal for controlling the power of the system.

Next, the operation of the power control circuit 30 will be described.

The designating operation of the saturation preventing control loop for preventing the RF power amplifier from saturating will be described. In this operation, the value of the reference voltage supplied to the reference voltage supply terminal 7 is designated so that the maximum transmission power is in a linear region of the RF power amplifier 3.

The variable gain amplifier 2 amplifies the modulated signal that is supplied from the input terminal 1 with a predetermined amplitude. The amplified signal with the maximum power is supplied to the RF power amplifier 3 through another amplifier, a filter, a mixer, and so forth (not shown).

Thus, the modulated signal is amplified by the RF power amplifier 3 regardless of whether or not the RF power amplifier 3 operates in the saturation range. The resultant signal with the maximum power is supplied from the signal output terminal 3out through the directional coupler 4. At this point, a part of the output power of the modulated signal that is supplied from the RF power amplifier 3 is coupled by the directional coupler 4 and detected by the detecting circuit 6. Thus, the magnification of the DC voltage component is detected. The DC voltage component of the modulated signal detected by the detecting circuit 6 is supplied to the negative input terminal 8in− of the comparator 8. On the other hand, the reference voltage at the reference voltage supply terminal 7 is supplied to the positive input terminal 8in+ of the comparator 8.

At this point, the reference voltage supplied to the reference voltage supply terminal 7 is increased by the reference voltage control circuit 40. Thus, since the signal level of the output signal from the comparator 8 becomes "H", the switch 9 is turned off. Consequently, the maximum transmission power of the system can be output from the signal output terminal 5 without an influence of the saturation preventing control loop 20.

The reference voltage control circuit 40 detects the maximum transmission power and varies the reference voltage corresponding to the detected power so that the RF power amplifier 3 outputs the maximum transmission power in the linear region.

When the reference voltage control circuit 40 decreases the reference voltage and thereby the voltage of the DC voltage component of the modulated signal that is supplied from the detecting circuit 6 becomes higher than the reference voltage, the signal level of the output signal from the output terminal 8out of the comparator changes from "H" to "L". Thus, the switch is turned on. The "L" output voltage corresponding to the difference between the reference voltage and the DC voltage component of the modulated signal is supplied to the adder 10.

The adder 10 adds the "L" output signal of the comparator 8 and the system power control signal supplied from the system power control terminal 11 and outputs the resultant signal to the gain control terminal 2c of the variable gain amplifier 2. Since the signal level of the output signal of the comparator 8 is negative, the signal level of the output signal that is supplied to the gain control terminal 2c is decreased and thereby the gain of the variable gain amplifier 2 is decreased.

Thus, the signal level of the modulated signal that is supplied from the variable gain amplifier 2 to the RF power amplifier 3 and the maximum transmission power that is supplied from the RF power amplifier 3 are decreased.

Consequently, the reference voltage control circuit 40 allows the RF power amplifier 3 to operate in a linear region rather than the saturation region corresponding to the value of the reference voltage. The optimum reference voltage is stored in a memory 41 of the reference voltage control circuit 40. The saturation preventing control loop allows the maximum transmission power to be optimally designated without need to consider the fluctuation of each system.

After the optimum maximum transmission power is designated, an operation for controlling the transmission power corresponding to the system power control signal is performed. Next, this operation will be described.

When the output power of the RF power amplifier 3 is decreased corresponding to the output signal of the system power control circuit 50, the system power control signal that causes the gain of the variable gain amplifier 2 to decrease is supplied as a predetermined input voltage from the system power control circuit 50 to the system power control terminal 11.

When the transmission power at this point is lower than the maximum transmission power, since the input voltage that is applied to the negative input terminal −8in of the comparator 8, the signal level of the output signal of the output terminal 8out of the comparator 8 becomes "H". Thus, the switch 9 is turned off. Since the switch 9 is turned off, no signal is supplied to the input terminal 10inA of the adder 10. Consequently, the system power control signal is supplied to the gain control terminal 2c of the variable gain amplifier 2, without an influence of the saturation preventing control loop 20.

Thus, since the variable gain amplifier 2 is controlled corresponding to the input voltage of the system power control terminal 11 through the adder 10, the output signal of the output terminal 2out of the variable gain amplifier 2 is decreased. Consequently, since the signal level of the input signal of the input terminal 3in of the RF power amplifier 3 is decreased, the output power of the output terminal 3out of the RF power amplifier 3 is decreased. Of course, as the output power of the RF power amplifier 3 decreases, the input voltage of the negative input terminal 8in of the comparator 8 proportionally decreases.

When the system power control signal causes the output power of the RF power amplifier 3 to decrease, the saturation preventing control loop 20 is disconnected. Thus, the system power control loop 21 allows the RF power amplifier 3 to operate normally.

When the output power of the RF power amplifier 3 is increased corresponding to the output signal of the system power control circuit 50, the system power control signal that causes the gain of the variable gain amplifier 2 to increase is supplied as a predetermined input voltage from the system power control circuit 50 to the system power control terminal 11.

When the transmission power at this point is lower than the maximum transmission power, since the switch is turned off, as with the case that the output power of the RF power amplifier 3 is decreased, the system power control loop 21 allows the RF power amplifier 3 to normally operate without an influence of the saturation preventing control loop 20.

In the case that the system power control signal that is supplied from the system power control terminal 11 causes the output power of the RF power amplifier 3 to increase over the predetermined maximum transmission power, when the output power at this point exceeds the maximum transmission power, the signal level of the output signal supplied from the output terminal 8out of the comparator 8 changes from "H" to "L". Thus, the switch 9 is turned on and the saturation preventing control loop 20 operates, thereby preventing the RF power amplifier 3 from operating in the saturation region.

As described above, according to the power control circuit of the first embodiment, the switch 9 causes the saturation preventing control loop 20 of the RF power amplifier 3 to operate only when the saturation preventing control loop 20 is required. Otherwise, the power control circuit causes the system power control loop 21 to normally operate.

In addition, since the reference voltage control circuit 40 measures and stores the reference voltage just corresponding to the predetermined maximum transmission power, it can very precisely designate the operation condition of the saturation preventing control loop.

Figure 4:
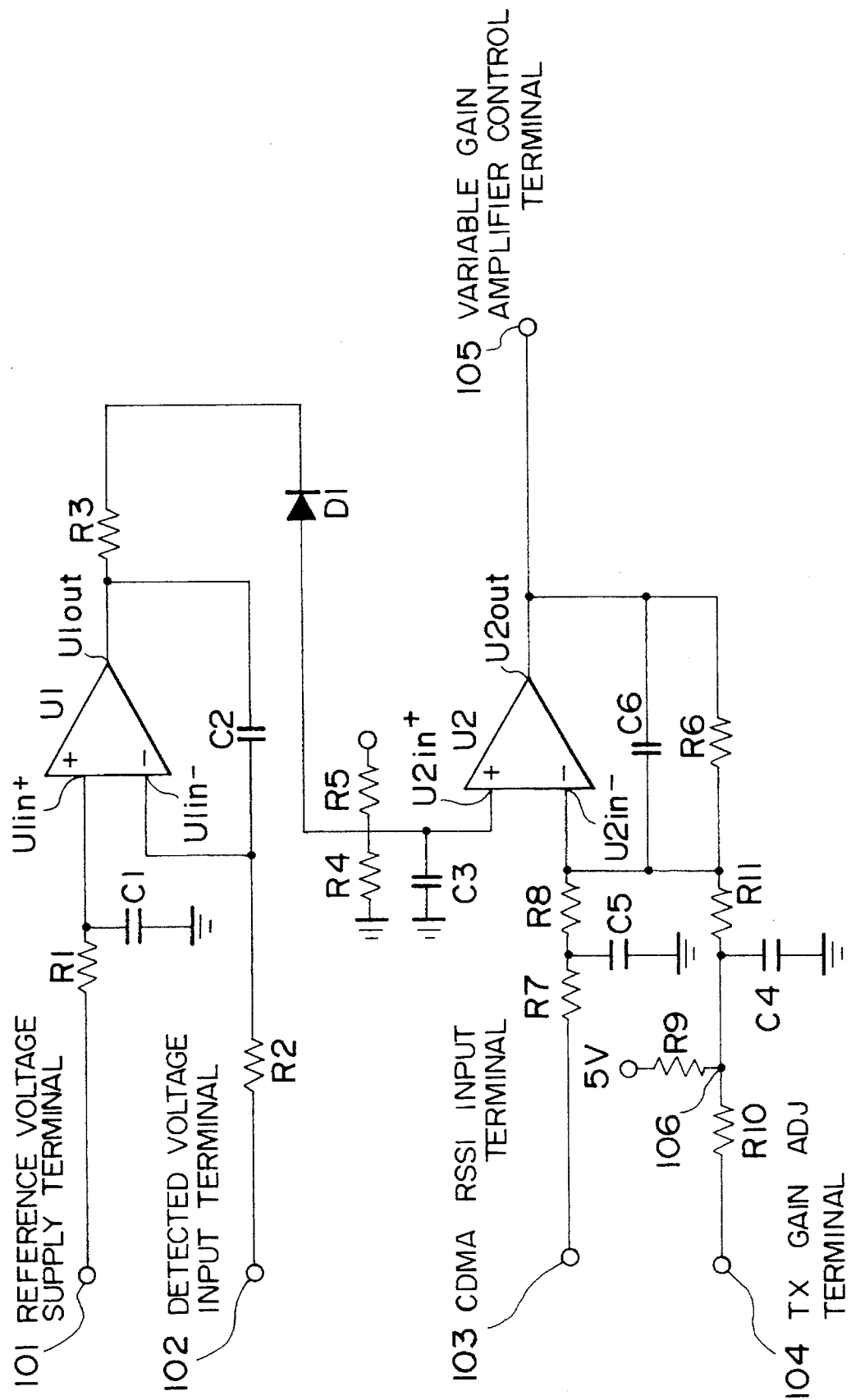
FIG. 4 is a circuit diagram showing the construction of a transmission power control block 31 of the power control circuit of FIG. 2.
Figure 5:
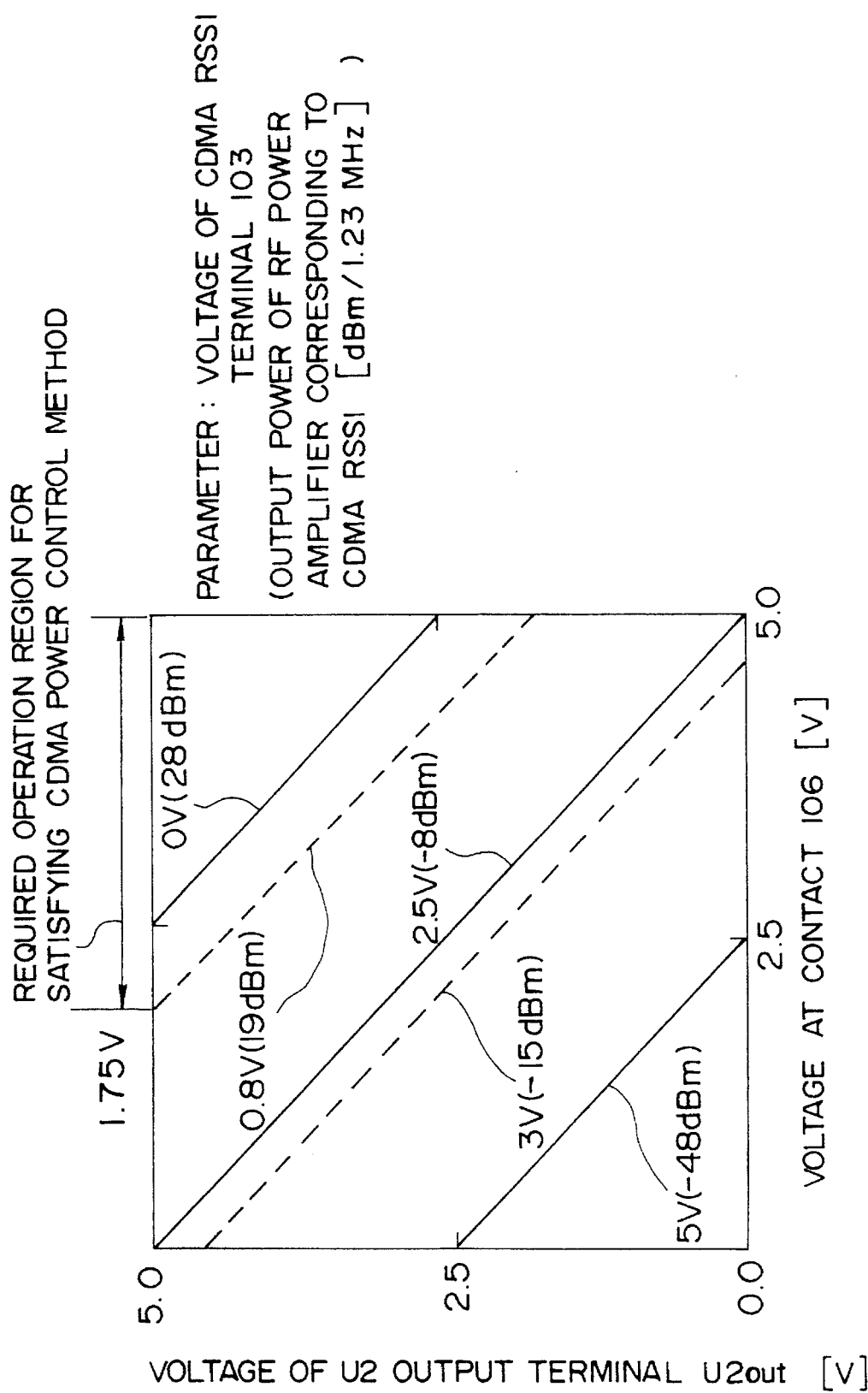
FIG. 5 is a graph showing an operation region of an OP amplifier U2.

Next, with reference to FIGS. 4 and 5, a second embodiment of the present invention will be described. In the second embodiment, the power control circuit according to the present invention is applied for a digital cellular according to the CDMA system. FIG. 4 is a circuit diagram showing the construction of the transmission power block 31 of FIG. 2. FIG. 5 is a graph showing the operation region of the OP amplifier U2 of the circuit.

The CDMA system is a communication system based on a spread spectrum technique. In the spread spectrum technique, a transmission signal is spread in a wider band than required. Thus, the spread spectrum technique has advantages of multiple access and confidence of communication. As the spread spectrum techniques, the direct spread method, the frequency hopping method, the chirp method, and so forth are known. In the direct spread method, a transmission signal is multiplied by a digital code sequence. In the frequency hopping method, a carrier frequency is varied corresponding to a code sequence. In the chirp method, a signal that is frequency modulated corresponding a linear sweeping pattern is used.

The CDMA system uses one of direct spread system. In the CDMA system, a digitized sound signal is multiplied by a pseud noise (PN) code to spread a transmission signal. The spread signal is not restored by a multiplication of another PN code. However, when the transmission side and the reception side have the same PN code, they can communication with each other.

For details of a communication system using the CDMA method, refer to "NIKKEI ELECTRONICS", pp 163–175, No. 579, Apr. 26, 1993. In a communication system corresponding to the CDMA system, to obtain the maximum system capacitance, it is important to control the transmission power. To do that, subscriber units corresponding to the CDMA system use two methods of open loop control and closed loop control.

In the open loop power control, it is assumed that uplink transmission signals and downlink transmission signals are attenuated in the same manner. The downlink transmission loss is estimated. Corresponding to the downlink transmission loss, the power necessary for the uplink transmission is predicted so as to adjust the transmission power of the subscriber unit.

Actually, since the uplink transmission signal and the downlink transmission signal are independently attenuated, in addition to the open loop control, the closed loop power control is also used. The power control information used in the uplink transmission includes a power control symbol to be transmitted at predetermined intervals along with a conventional symbol sequence of the downlink transmission. The power control symbol is determined corresponding to the signal intensity of the uplink transmission signal received by a ground station.

The constructional portions of FIG. 4 accord with those of FIG. 2. The circuit shown in FIG. 4 includes a reference voltage supply terminal 101 (that accords with the reference voltage supply terminal 7), a detected voltage input terminal 102 (that accords with the negative input terminal 8in– of the comparator 8), a CDMA RSSI (received signal field intensity) input terminal 103 of a reception portion, a TX GAIN ADJ terminal 104 (that accord with the system power control terminal 11), and a variable gain amplifier control terminal 105 (that accords with the output terminal 10out of the adder 10).

Among of these terminals, the CDMA RSSI (received signal field intensity) input terminal 103 of the reception portion is used for controlling the power of the open loop. The TX GAIN ADJ terminal 104 is used for controlling the power of the closed loop. The variable gain amplifier control terminal 105 is used for outputting a signal that controls the gain of the variable gain amplifier.

The reference voltage supply terminal 101 is connected to a resistor R1 (25 kΩ). This resistor R1 is connected to a positive input terminal U1in+ of an OP amplifier U1 and one terminal of a condenser C1 (0.01 µF). The other terminal of the condenser C1 is grounded.

The detected voltage input terminal 102 is connected to a resistor R2 (2.2 kΩ). This resistor R2 is connected to a negative input terminal U1in– of the OP amplifier U1 and one terminal of a condenser C2 (0.01 µF). The other terminal of the condenser C2 is connected to an output terminal U1out of the OP amplifier U1.

The output terminal U1out of the OP amplifier U1 is connected to a resistor R3 (820Ω). The register R3 is connected to one terminal of the diode D1. The other terminal of the diode D1 is connected to a resistor R4 (4.7 kΩ), a resistor R5 (4.7 kΩ), one terminal of the condenser C3 (0.01 µF), and a positive input terminal U2in+ of the OP amplifier U2. The resistor R4 and the other terminal of the condenser C3 are grounded. A voltage of 5 V is applied to the other terminal of the resister R5.

On the other hand, the CDMA RSSI input terminal 103 of the CDMA power control signal is connected to a resistor R7 (18 kΩ). The resistor R7 is connected to a resistor R8 (18 kΩ) and one terminal of a condenser C5 (4.7 µF). The resistor R8 is connected to a negative input terminal U2in– of the OP amplifier U2. The other terminal of the condenser C5 is grounded.

Likewise, the TX GAIN ADJ input terminal 104 of the CDMA power control signal is connected to a resistor R10 (27 kΩ). The resistor R10 is connected to a resistor R9 (47 kΩ), an R11 (33 kΩ), and one terminal of a condenser C4 (0.022 µF). The resistor R11 is connected to a negative input terminal U2in– of the OP amplifier U2, a condenser C6 (820 pF), and one terminal of a resistor R6 (33 kΩ). A voltage of 5 V is applied to the other terminal of the resistor R9. The other terminal of the condenser C4 is grounded. The condenser C6 and the other terminal of the resistor R6 are connected to an output terminal U2out of the OP amplifier U2. The output terminal U2out of the OP amplifier U2 is connected to the variable gain amplifier control terminal 105.

Next, the operation of the second embodiment will be described.

When the reception power of the communication unit is −105 dBm/1.23 MHz, the signal level of the CDMA power control signal at the CDMA RSSI terminal 103 for the open loop power control becomes "L". When the reception power varies over 105 dBm/1.25 MHz, the signal level of the CDMA power control signal becomes "H".

When the communication unit successively receives 100 or more CDMA control "0" bits from a ground station, the signal level at the TX GAIN ADJ terminal 104 for the closed loop power control becomes "L". When the communication unit successively receives 100 or more CDMA control "1" bits from ground station, the signal level at the TX GAIN ADJ terminal 104 becomes "H".

When the output power of the RF power amplifier is in a predetermined range, since the reference voltage that is supplied to the reference voltage supply terminal 101 is higher than the input voltage of the detected voltage input terminal 102, the signal level of the output signal of the OP amplifier U1 that is a comparator becomes "H". Thus, the diode D1 is turned off. Consequently, the output signal with signal level "H" of the OP amplifier U1 is not supplied to the OP amplifier U2. Since the diode D1 is turned off, the saturation preventing control loop is disconnected. Thus, the unit can normally operate according to the CDMA power control method.

At this point, when both the signal levels at the CDMA RSSI terminal 103 and the TX GAIN ADJ terminal 104 become "L", since these terminals are connected to the negative input terminal U2in– of the OP amplifier U2, the signal level at the output terminal U2out of the OP amplifier U2 becomes "H". The output signal with signal level "H" is supplied from the variable gain amplifier control terminal 105. Thus, as the output power of the variable gain amplifier increases, the output power of the RF power amplifier increases.

When the output power of the RF power amplifier exceeds a predetermined range, since the input voltage at the detected voltage input terminal 102 becomes higher than the reference voltage that is supplied to the reference voltage supply terminal 101, the signal level of the output terminal U1out of the OP amplifier U1 becomes "L". Thus, the diode D1 functions as a switch and is turned on. When the diode D1 is turned on, the output voltage of the OP amplifier U1 is applied to the positive input terminal U2in+ of the OP amplifier U2, thereby causing the output voltage of the OP amplifier U2 to decrease. Consequently, since the gain of the variable gain amplifier decreases, the RF power amplifier can be prevented from operating in the saturation region.

When a signal with signal level "H" is supplied to the negative input terminal U2in− of the OP amplifier U2, a signal at a lower voltage than before is supplied from the output terminal U2out of the OP amplifier U2. Thus, the gain of the variable gain amplifier decreases and thereby the output power of the RF power amplifier and the detected voltage of the signal that is supplied to the detected voltage input terminal 102 decrease.

In this case, when the voltage at the reference voltage supply terminal 101 becomes higher than the voltage at the detected voltage input terminal 102, the signal level at the output terminal out8 of the OP amplifier 1 that is a comparator becomes "H". Thus, the diode D1 is turned off. When the diode D1 is turned off, the saturation preventing control loop is disconnected. Consequently, the unit can normally operate according to the CDMA power control method.

Figure 1:
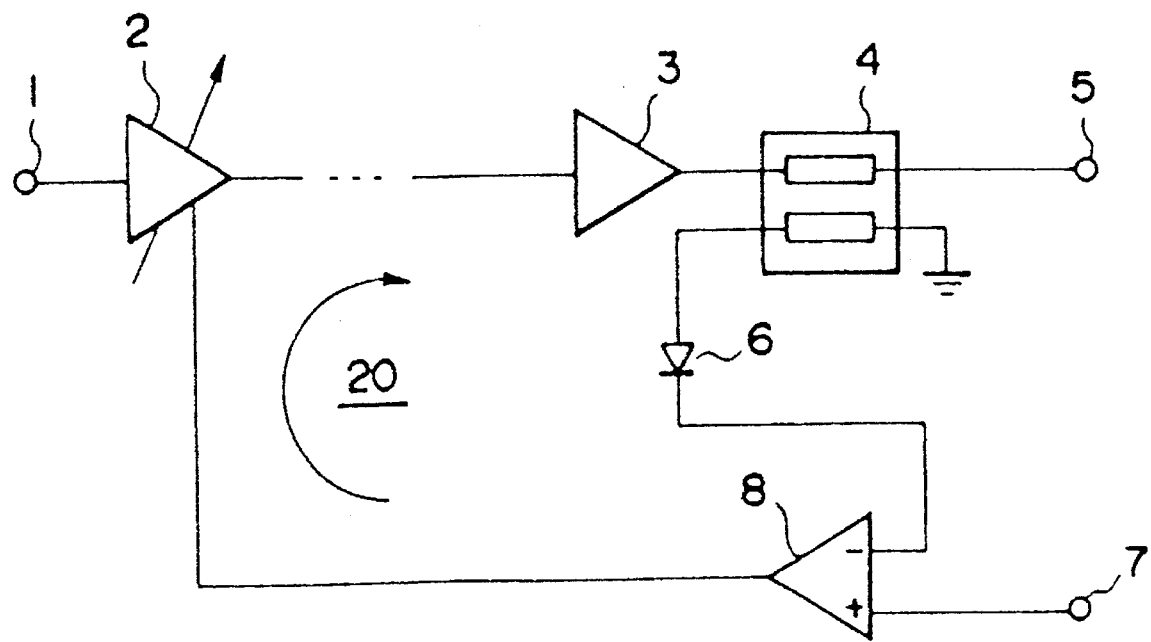
FIG. 1 is a circuit diagram showing the construction of a conventional power control circuit.

As described above, according to the second embodiment, the control circuit shown in FIG. 1 is used for the power control of the CDMA digital cellular system and the diode D1 is used as a switch. Thus, as with the first embodiment, the saturation preventing control loop can be operated when necessary. Consequently, the RF amplifier can be prevented from operating in the saturation region.

The transmission power control block 31 is operated as described above. Next, the operation for adding the signals that are supplied to the CDMA RSSI terminal 103 and the TX GAIN ADJ terminal 104 and for causing the OP amplifier U2 to process the added result will be described in detail.

The OP amplifier U2 can linearly operate in the range of 0 V to 5 V. In other words, the output voltage should be designated in this range.

In the condition that the resistors R9 and R10 and the condensers C4 are connected to the TX GAIN ADJ terminal 104 to which the closed loop control power control input signal for the closed loop control is supplied at 5 V, when the number of pulses of the pulse density modulation (PDM) signal that is supplied from the TX GAIN ADJ terminal 104 varies, the voltage at a contact 106 of FIG. 4 varies from 1.8 V to 5 V. Thus, as is clear from the operation region of FIG. 5, the OP amplifier can operate in the linear region regardless of the voltage of the input signal supplied from the CDMA RSSI terminal 103. As a result, the input voltage range of the OP amplifier U2 can be limited to a voltage range of which the OP amplifier U2 operates in the linear amplification region and the CDMA power control standard are satisfied.

In these embodiments, the variable gain amplifier and the RF amplifier were described as independent amplifiers. However, the present invention is not limited to such a construction. Instead, the present invention can be applied to a system of which the variable gain amplifier should operate in the linear region so as to control the output power of the variable gain amplifier. Alternatively, when the variable gain amplifier 2, another amplifier, a filter, a mixer (they are not shown), and the RF power amplifier 3 are integrally formed as a variable gain amplifier system that should operate in the linear region, the present invention can be applied for this system.

According to the present invention, since the saturation preventing control loop is provided with a switch, only when the signal level of the amplified signal is larger than the reference value, the switch is turned on and the saturation preventing control function operates. Otherwise, the power control loop that is excellent in loop response time and output power detecting characteristics properly functions corresponding to the system power control signal supplied from the system power control terminal.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. A power control circuit for use with a transmitter, comprising variable gain amplifying means, having an input terminal for receiving an input signal, an output terminal, and a gain control terminal for receiving a gain control signal, said variable gain amplifying means including means for amplifying the input signal to provide a linearly amplified signal at said output terminal with a gain controlled by the gain control signal;

detecting means for detecting a signal level of the amplified signal;

comparing means for comparing the signal level detected by said detecting means with a reference value, to obtain a comparison result indicative of which of the signal level detected by said detecting means and a level of the reference value is larger;

a switch having a signal input terminal connected for receiving the comparison result from said comparing means and an output terminal for providing the comparison result when said switch is closed, said switch having means, responsive to the comparison result, for closing said switch when the comparison result indicates that the signal level detected by said detecting means is larger than the level of the reference value and for opening said switch when the comparison result indicates that the signal level detected by said detecting means is smaller than the level of the reference value; and a system power control circuit having a first input terminal and having a second input terminal coupled to the output terminal of said switch, said system power control circuit including means for adding a system power control signal at said first input terminal to an addend signal at said second input terminal to produce a sum, and providing the sum to said gain control terminal as the gain control signal, wherein said addend signal is the comparison result when said switch is closed, and is a null signal when said switch is open.

2. A power control circuit as set forth in claim 1, wherein said comparing means provides as the comparison result a signal having a level based on the difference between the signal level detected by said detecting means and the level of the reference value.

3. A power control circuit as set forth in claim 1, wherein said variable gain amplifying means provides the amplified signal at a signal level greater than a signal level of the input signal.

4. The power control circuit as set forth in claim 1, further comprising a reference value control means for varying the reference value based on the signal level of the amplified signal.

5. The power control circuit as set forth in claim 1, wherein said power control circuit includes a reference value control circuit having means for varying the reference value of said comparing means corresponding to the detected signal level.

6. The power control circuit as set forth in claim 1, wherein said switch is constructed of a diode.

7. A power control circuit for use with a transmitter, comprising a variable gain amplifier, having an input terminal for receiving an input signal, an output terminal, and a gain control terminal for receiving a gain control signal, said variable gain amplifier having means for amplifying the input signal to provide an amplified signal at said output terminal with a gain controlled by the gain control signal;

an RF power amplifier for linearly amplifying the amplified signal to obtain a linearly amplified signal;

detecting means for detecting a signal level of the linearly amplified signal;

comparing means for comparing the signal level detected by said detecting means with a reference value to obtain a comparison result indicative of which of the signal level detected by said detecting means and a level of the reference value is larger;

a switch having an input terminal connected for receiving the comparison result from said comparing means and an output terminal for providing the comparison result when said switch is closed, said switch having means, responsive to the comparison result, for closing said switch when the comparison result indicates that the signal level detected by said detecting means is larger than the level of the reference value, and for opening said switch when the comparison result indicates that the signal level detected by said detecting means is smaller than the level of the reference value; and an adding circuit having a first input terminal and having a second input terminal coupled to the output terminal of said switch, said adding circuit including means for adding a system power control signal at said first input terminal to an addend signal at said second input terminal to produce a sum, and providing the sum to said gain control terminal as the gain control signal, wherein said addend signal is the comparison result when said switch is closed, and is a null signal when said switch is open.

8. A power control circuit as set forth in claim 7, wherein said comparing means provides as the comparison result a signal having a level based on the difference between the signal level detected by said detecting means and the level of the reference value.

9. A power control circuit as set forth in claim 7, wherein said RF power amplifier provides the linearly amplified signal at a signal level greater than a signal level of the input signal.

10. The power control circuit as set forth in claim 7, further comprising a reference value control means for varying the reference value based on the signal level of the linearly amplified signal.

11. The power control circuit as set forth in claim 7, wherein said power control circuit includes a reference value control circuit having means for varying the reference value of said comparing means corresponding to the detected signal level.

12. The power control circuits as set forth in claim 11, wherein said switch is constructed of a diode.

* * * * *